(12) United States Patent
Newland

(10) Patent No.: US 6,407,552 B1
(45) Date of Patent: Jun. 18, 2002

(54) TESTING OF BIMETALLIC ACTUATORS WITH RADIO FREQUENCY INDUCTION HEATING

(75) Inventor: Charles Allen Newland, Degraff, OH (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 09/797,452

(22) Filed: Mar. 1, 2001

Related U.S. Application Data

(63) Continuation-in-part of application No. 09/019,633, filed on Feb. 6, 1998, now Pat. No. 6,246,241.

(51) Int. Cl.⁷ .................. G01R 31/02; G01N 25/00; H05B 6/10; B07C 5/02
(52) U.S. Cl. .................. 324/424; 324/423; 374/45; 219/602; 209/538
(58) Field of Search .................. 324/424, 423, 324/422, 760; 374/45; 219/600, 661, 602; 337/102; 209/3.1, 538

(56) References Cited

U.S. PATENT DOCUMENTS

| | | | |
|---|---|---|---|
| 3,587,022 A | 6/1971 | Hire | 337/89 |
| 3,670,131 A * | 6/1972 | Beaud | 219/602 |
| 4,090,166 A | 5/1978 | Burch | 337/360 |
| 5,397,998 A * | 3/1995 | Soena et al. | 324/760 |
| 5,614,878 A | 3/1997 | Patrick et al. | 335/14 |
| 5,916,463 A | 6/1999 | Hoving et al. | 219/121.85 |

* cited by examiner

Primary Examiner—N. Le
Assistant Examiner—Anjan K Deb
(74) Attorney, Agent, or Firm—Foley & Lardner

(57) ABSTRACT

A test apparatus to determine the trip setting of a bimetallic element of a thermal tripping mechanism of the circuit breaker. The apparatus comprising a conveyance configured to receive and move the circuit breaker. A radio frequency induction heater positioned below the conveyance and including an induction coil operatively connected to the induction heater, wherein the induction coil is located below the bimetallic element of the thermal tripping mechanism of the circuit breaker. The radio frequency induction heater may operate with a frequency of 250 KHz to 750 KHz. The test apparatus can also include a mechanical ejection apparatus configured to remove the circuit breaker from the conveyance if the circuit breaker did not meet predetermined criteria and an electrical test apparatus configured to test the circuit breaker if the circuit breaker met predetermined criteria.

15 Claims, 1 Drawing Sheet

TESTING OF BIMETALLIC ACTUATORS WITH RADIO FREQUENCY INDUCTION HEATING

This is a continuation-in-part of application Ser. No. 09/019,633, filed Feb 6, 1998, now U.S. Pat. No. 6,246,241.

FIELD OF THE INVENTION

The present invention relates generally to testing of bimetallic-motivated mechanical and electromechanical control circuits, circuit breakers, switches and similar devices, and more particularly to a method and an apparatus to quickly, effectively, and at a low cost thermo-mechanically test bimetallic-motivated electromechanical circuit breakers by heating the bimetallic actuator of the circuit breaker.

BACKGROUND OF THE INVENTION

In electrical control circuits and in electrical circuit breakers, thermal responsive controls or actuators may be connected in the lines or in the circuit breaker to open the circuit or circuit breaker in the event of abnormal current conditions and the like. Such thermal overload controls may take a variety of different forms including bimetal elements forming a current conducting contact or a switch or circuit breaker. If the current rises above a selected level, the heating effect on the bimetal element, with well known differences of thermal expansion and contraction of the individual elements, is such as to actuate the switch or the thermal tripping mechanism of the circuit breaker. Electromechanical circuit breakers open the electrical current path when the electrical circuits that they protect are conducting excessive current. The duration of opening time, under overload conditions, is controlled by a bimetallic actuator.

The thermal tripping function of a circuit breaker is dependent on thermal heating which is created during operating conditions if excessive current flows through the circuit breaker. An example of such thermal trip mechanisms is described in U.S. Pat. 5,614,878 assigned to the assignee of the present invention and is hereby incorporated by reference. The heating causes the bimetal to deflect which in turn causes a mechanical force that will trip the circuit breaker, terminating the excessive current flow. Each circuit breaker must be tested to assure that the tripping times conform with the trip time limits specified in Circuit Breaker Performance Specifications. It is necessary to test the movement of the bimetal element because the deflection versus temperature characteristic within the operating range of the bimetal is very flat. This test is called thermal calibration.

Subjecting the entire circuit breaker to heat in order to test the response of the bimetal mechanism to temperature, such as in an oven, See FIG. 2, is impractical because of the presence of each other temperature sensitive subcomponents susceptible to overheating, i.e., plastic parts, lubricants, etc., which could lead to the destruction of the circuit breaker. Similarly, direct contact application of heat is too limiting because access to the inner portions of the circuit breaker is oftentimes physically impracticable and always extraordinarily time consuming.

Referring to FIG. 1, one typical method of thermally calibrating circuit breakers is by injecting a fixed level of electrical current (i) for a given time duration (t). This controlled unit of electrical energy ($i^2t$) causes a bimetal deflection, which functionally converts the electrical energy to mechanical energy manifested as a force operating through a distance. The mechanical energy so produced by the bimetal is used to open the circuit breaker's trip release actuator.

The prior art methods of electrical current injection for thermal calibration uses trial and error to identify circuit breakers that have thermal calibration abnormalities. Several failed attempts at such electrical current injection testing must be completed before the breaker can be identified as one that cannot pass the thermal calibration.

The thermal calibration test requires that each circuit breaker be mechanically and electrically connected to a test apparatus and a mechanical test fixture. This requires a human operator to insert and remove the circuit breaker from the test apparatus and fixture. The performance of the actual test, as contrasted to its setup and connection, and to cool the circuit breaker to ambient for retesting takes from thirteen (13) to twenty-six (26) seconds to perform. Repeat testing attempts that are presently performed on circuit breakers that have characteristics that are out of acceptable limits includes resetup time and reconnect time in addition to the actual test time. When setup times, connection times, operator action times and repeated cool to ambient times (approximately two (2) hours between each test) for the retest are summoned, the amount of time needed to perform the thermal calibration cycle of tests before a circuit breaker can be identified as one that cannot be thermally calibrated can reach five (5) hours. As is typical in the prior art after three (3) bad tests for a circuit breaker, it is sent for teardown.

Each circuit breaker's electrical to mechanical energy conversion ratio varies slightly from a statistical average or norm. The energy conversion differences between one circuit breaker and a second identical circuit breaker can have many causes. Most are caused by minor electrical resistance changes in the circuit breaker's electrical current path. These variations are small, occur infrequently, and rarely produce a thermal calibration failure of the circuit breaker.

Each circuit breaker's trip release actuator also has a unique release energy (force×distance) requirement. The relative differences in the unique trip release actuator energy requirement between one circuit breaker and another identical circuit breaker can be large. The energy required to actuate the trip release actuator of such circuit breakers which sustain a thermal calibration failure is excessive. An unacceptably high level of new assembled circuit breakers can oftentimes sustain a thermal calibration failure.

If a circuit breaker trips during testing but either before a minimum set time or after a maximum set time, an adjustment must be performed and typically involves manually adjusting a screw which will bring the circuit breaker trip-mechanism into acceptable operating limits. The calibration adjustment involves changing the position of the applied force, created by the thermal expansion of the bimetal, to that new position which initiates the release of the trip mechanism within the required time. Calibration is performed, for most thermostatic bimetal operated circuit breakers, by such a screw adjustment. Although such a calibration adjustment might appear by the simplicity of its design to be insubstantial, it is a significant step in the manufacture of the circuit breaker without which a failed circuit breaker could not subsequently pass calibration retests and would be discarded. Furthermore, the calibration change adjustment requires an enormous amount of time involving an elapsed test time, the time to perform the adjustment, the time for the circuit breaker to cool down, followed by at least one additional elapsed test time duration. Frequently, during circuit breaker calibration, the above cycle of steps is oftentimes repeated many times thereby driving production costs even higher.

Thus, the thermal calibration test using the electrical current injection method must be repeated after each manual screw adjustments is made to determine if the circuit breaker has been brought into acceptable operating limits. Repeated electrical current injection thermal calibration testing of an as yet unknown mechanically failed electric circuit breaker is obviously a total waste of time of production assets and simply increases costs. The ability to reliably determine and isolate, mechanically failed circuit breakers prior to performing electrical testing of the electromechanical components of the circuit breaker, enhances effective failure analysis, reduces production time testing, and increases cost savings.

To further exacerbate the situation, when a circuit breaker's release actuator requires more mechanical operating energy than that which can be provided within a required time limit by the circuit breaker's bimetal, the circuit breaker cannot be calibrated. Although many conditions can cause the trip release actuator to require such excessive energy, typically they include parts or subcomponents that are out of tolerance, improper lubrication, excessive friction, damaged parts or subcomponents, improper assembly, and unknown or subtle undetectable mechanical factors. Prior art electric current injection calibration processes will not identify those breakers which have these subtle mechanical conditions or anomalies. Accordingly, several failed thermal calibration tests performed in accordance with the prior art electrical current injection calibration processes oftentimes must be completed before it can be concluded that the circuit breaker is not capable of being successfully thermally calibrated.

Thus, the determination that any particular circuit breaker which has failed a thermal calibration test is inevitably incapable of being successfully calibrated, presently requires excessive amounts of testing, incurs substantial costs, and involves inordinate amounts of time without any positive benefit.

Thus, if confirmation of the proper functioning/performance of all the mechanical components of the circuit breaker can be achieved early in the production and qualification of the circuit breaker, then the electrical injection test which is used to test and qualify the electrical response of the components of the circuit breaker can be subsequently performed on mechanically confirmed qualified circuit breakers. Any failure to conform to electrical test standards during a subsequent electrical injection test would therefore be indicative of an electromechanical problem to the exclusion of a mechanical problem. The prior art devices and methods to qualify the circuit breaker employ the electrical current injection test to simultaneously perform both the qualification test for the mechanical performance as well as the electromechanical performance of the circuit breaker. Accordingly, the prior art testing methods using current injection are incapable of distinguishing between a mechanical performance problem and an electro-mechanical performance problem in a failed circuit breaker.

Accordingly, there exists a substantial need for a process which can achieve rapid, effective, and low cost identification of those circuit breakers that are not capable of being thermally calibrated. This further increases production costs.

Accordingly, there exists a need for a process which avoids the electrical current injecting test to thermally test a circuit breaker bimetallic mechanism.

Accordingly, there exists a need for a process which can test the mechanical performance of a circuit breaker independent of and before any electrical energy test of the mechanical and electrical components of the circuit breaker.

It would thus be an advantage over the prior art to provide a method which will be able to confirm the mechanical performance of the circuit breaker, independent of and prior to conducting any electrical performance test, and to do so without the need for any test or interface hookups.

Accordingly, it would be a further advantage over the prior art to provide a method to increase the production through-put in the manufacture of electrical circuit breakers by qualifying the thermal and mechanical performance of the circuit breaker early in the production of the device.

SUMMARY OF THE INVENTION

The present invention provides a test apparatus to determine the trip setting of a bimetallic element of a thermal tripping mechanism of the circuit breaker. The apparatus comprising a conveyance configured to receive and move the circuit breaker. A radio frequency induction heater positioned below the conveyance and including an induction coil operatively connected to the induction heater, wherein the induction coil is located below the bimetallic element of the thermal tripping mechanism of the circuit breaker. The radio frequency induction heater may operate with a frequency range of 250 KHz to 750 KHz. The test apparatus can also include a mechanical ejection apparatus configured to remove the circuit breaker from the conveyance if the circuit breaker did not meet predetermined criteria and an electrical test apparatus configured to test the circuit breaker if the circuit breaker met predetermined criteria.

The present invention also provides a test apparatus to heat a bimetallic element of a thermal tripping mechanism of the circuit breaker to a predetermined temperature that will trip the tripping mechanism. The test apparatus comprises a conveyance configured to receive and move the circuit breaker. A radio frequency induction heater positioned underneath the conveyance and an induction coil operatively connected to the induction heater, wherein the induction coil is located below the bimetallic element of the thermal tripping mechanism of the circuit breaker. The test apparatus can also include a mechanical ejection apparatus configured to remove the circuit breaker from the conveyance if the circuit breaker did not meet predetermined criteria and an electrical test apparatus configured to test the circuit breaker if the circuit breaker met predetermined criteria.

The present invention further provides a test apparatus to heat a bimetallic element of a thermal tripping mechanism in the circuit breaker to a predetermined temperature that will deflect the bimetal element in the thermal tripping mechanism in response to such temperature. The test apparatus comprising a conveyance configured to receive and move the circuit breaker, a radio frequency induction heater positioned below the conveyance and an induction coil operatively connected to the induction heater, wherein the induction coil is located below the metallic element of the thermal tripping mechanism of the circuit breaker. The radio frequency induction heater may operate within a frequency range of 250 KHz to 750 KHz. The test apparatus may include a mechanical ejection apparatus configured to remove the circuit breaker from the conveyance if the circuit breaker did not meet predetermined criteria and an electrical test apparatus configured to test the circuit breaker if the circuit breaker met the predetermined criteria.

The present invention further provides a test apparatus to determine the trip setting of a bimetallic element of a thermal tripping mechanism of the circuit breaker. The test apparatus comprising a means for conveying configured to receive and move the circuit breaker, a means for generating heat positioned underneath the means for conveying, and a means for inducing heat operatively connected to the means for generating heat wherein the means for inducing heat is located below the bimetallic element of the thermal tripping mechanism of the circuit breaker. The means for generating heat may operate within a frequency of 250 KHz to 750 KHz. The test apparatus may also include a means for mechanically ejecting the circuit breaker from the means for conveying if the circuit breaker did not meet predetermined criteria and a means for electrically testing the circuit breaker if the circuit breaker met predetermined criteria.

DETAILED DESCRIPTION OF THE PREFERRED EMBODIMENTS

Figure 1:
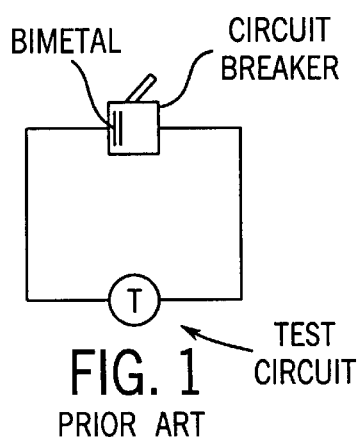
FIG. 1 is a schematic that illustrates the prior art electrical current injection method of testing the bimetallic element of a circuit breaker.
Figure 2:
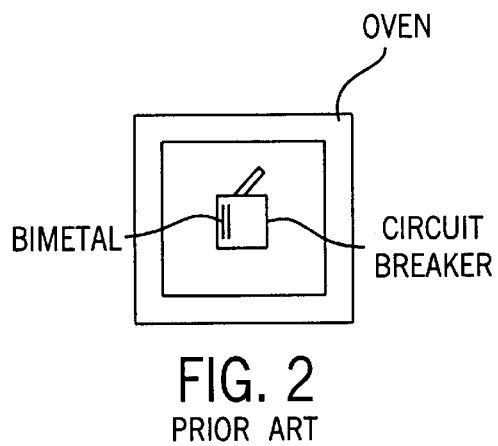
FIG. 2 is a schematic that illustrates the prior art oven method of testing the bimetallic element of a circuit breaker.
Figure 3:
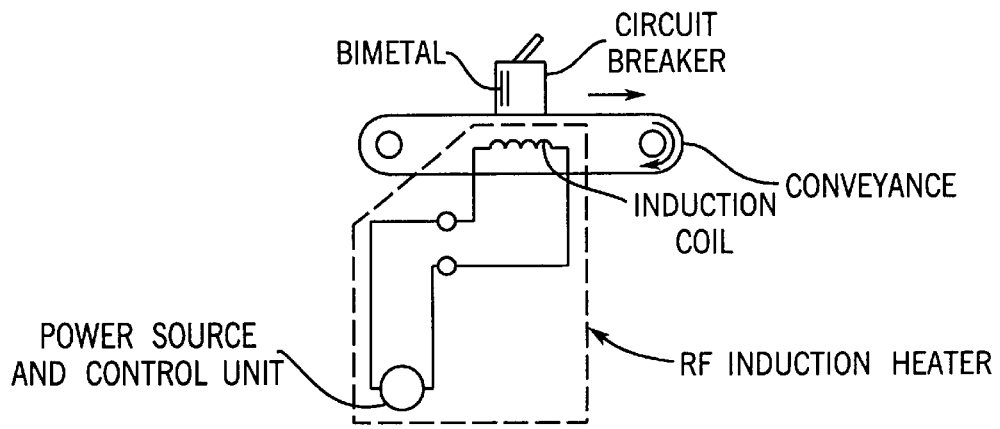
FIG. 3 is a schematic illustration of an exemplary embodiment of a radio frequency induction heating test apparatus to test a bimetallic element of a thermal tripping mechanism of a circuit breaker.
Figure 4:
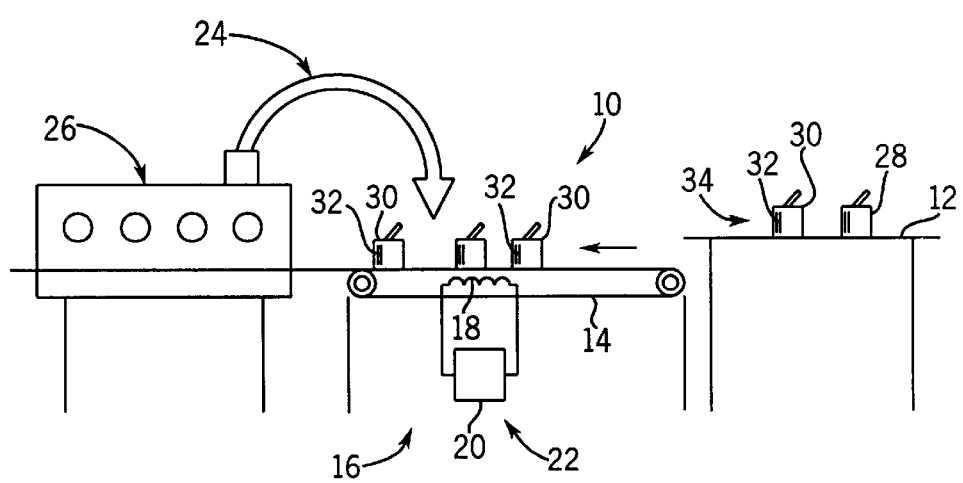
FIG. 4 schematic illustration of an exemplary embodiment of a test apparatus for a circuit breaker including a radio frequency induction heating apparatus, a mechanical ejection apparatus and an electric test apparatus.

Referring now to FIGS. 3 and 4, with the foregoing and other objectives in view and to overcome the above-described limitations of the prior art, there is provided, in accordance with the present disclosure, an apparatus 10 for testing the thermal trip setting of a thermal tripping mechanism 34 utilized in an electric circuit breaker 30 or electric switch 28, wherein the trip mechanism 34 includes a bimetallic element 32 deflectable in response to overload current through the circuit breaker by heating the bimetallic element 32 by radio frequency induction heat to a predetermined level to induce a thermal trip of the thermal tripping mechanism 34. A power source 20 and control unit 22 are coupled to the induction coil 18 of the radio frequency induction heater 16.

Radio frequency induction heating of the bimetal actuator 32 will permit a calibration pretest without requiring a mechanical or electrical connection to the circuit breaker 30, or to a test fixture. The apparatus 10 significantly increases the efficiency of the thermal calibration process by quickly and accurately identifying those circuit breakers 30 or electric switches 28 that require excessive energy to release the thermal tripping mechanism 34 of the tested devices. Circuit breakers 30 that do not meet predetermined criteria established for electrical ratings of the circuit breakers being tested can be removed from the conveyance 14 by an appropriate mechanical ejection apparatus 24. The position of the operating toggle or handle of the circuit breaker 30 or electrical switch 28 can be used to indicate the state of the circuit breaker. Typically the operating toggle will have an "ON", "OFF" and "TRIPPED" position. Monitoring these three positions with, for example, photo cells and fiber optics or other devices linked to trip time measurement equipment provide the opportunity to automate the acceptance or rejection of the circuit breaker 30 or electric switch 28. The mechanical ejection apparatus 24 can be associated with the conveyance 14 and manually or automatically operated. A robotic ejection apparatus can be utilized that pushes, lifts or drops non-complying circuit breakers to remove them from the conveyance 14.

Thus, in accordance with the process of the present invention, the identification and screening of those circuit breakers that are not capable of subsequently being calibrated can be accomplished independent of and before any electromechanical testing/calibration of the circuit breaker, and is accomplished within a period of seconds at very low cost. Moreover, a further benefit of the process of the present invention is that it eliminates the expensive, time consuming repeated attempts at thermal calibration that are required to be performed on circuit breakers that have failed because of responses which are out of limits.

The apparatus 10 of the present invention can be utilized with minimal human operator intervention and within a period of seconds, i.e., the time it takes for the temperature of the bimetal element of the thermal tripping mechanism to be raised to the temperature that will trip the circuit breaker 30. Thus, if a circuit breaker has an out of limits trip release actuator energy requirement as determined by the process of the present invention, it will not trip and can be removed from any further attempts at calibration or testing. Thus, the apparatus 10 of the present invention results in improving the speed of the qualification of circuit breakers which cannot be calibrated. In addition, the apparatus 10 of the present invention results in the ability to correctly identify test failures as mechanical by a separate defined test. This enables subsequent testing for electromechanical performance to be conducted only on circuit breakers that have mechanically qualified bimetallic trip mechanism. Such qualified circuit breakers, i.e., ones that meet predetermined criteria, can be tested with an electric test apparatus 26 to further test and calibrate the circuit breaker 30 for its intended rating performance.

Referring to FIG. 4, the conveyance 14 can be a suitable conveyor apparatus utilizing a belt or plastic assembly. The conveyor apparatus must not be influenced by the induction coil 18 connected to the radio frequency induction heater 16. A suitable assembly table 12 can be positioned near or next to the conveyance 14. The assembly table 12 is used to assemble the circuit breaker 30. The circuit breaker 30 are then moved, either normally or automatically to the conveyance 14. The conveyance 14 moves the circuit breaker 30 so that the bimetallic element 32 of the thermal tripping mechanism 34 of the circuit breaker 30 is positioned over the induction coil 18. In other words, the induction coil 18 is located below bimetallic element 32. The induction coil 18 may be mounted between portions of the conveyance 14 as shown in FIGS. 3 and 4 or the induction coil may be mounted underneath the conveyance 14. In either case, the induction coil 18 is below the bimetallic element 32.

Experimental tests have been carried out with BQD, single pole, 20 ampere circuit breakers. More specifically, radio frequency induction heating was applied during several test cycles to induce the thermal trip of the thermal tripping mechanism of the circuit breakers. The tests were conducted with a radio frequency induction heater 16, operating frequency range of 250–750 KHz, maximum output heating power of 2 KW, work coil reactive power of 50 Kva, and input power of 3 KW maximum. The induction coil 18 used in the tests are 3/16 inch diameter copper tubing formed into 1½ loops with an outer loop diameter of 2¼ inches. The induction heater 16 was operated during the tests at 450 KHz and 80% heat control.

Induction heating is well known in the prior art and is described in many treatises as well as in *McGraw-Hill Dictionary of Scientific and Technical Terms,* 1972, "Induction Heating" pp 94–97, which is hereby incorporated by reference.

The tests show the effects of radio frequency induced heating of sample circuit breakers 30 on the response time of the bimetallic element to thermally trip the thermal tripping mechanism 34 under various conditions and positions relative to the induction coil 18. The results of the testing are set forth in Table 1.

TABLE 1

Samples are BQD Single Pole, 20 amp, Circuit Breakers

| | 1 | 2 | 3 | 4 |
|---|---|---|---|---|
| TEST 1 Sample (at room temperature) | | | | |
| Time Heating to trip (sec) | 12.0 | 10.5 | 8.9 | 11.0 |
| TEST 2 Sample (same samples at room temperature after Test 1 "Retest") | | | | |
| Time Heating to trip (sec) | 10.7 | 12.4 | 9.8 | 13.6 |
| | 12.4 | 12.0 | 10.2 | 13.7 |
| | 12.8 | 12.0 | 10.0 | 13.7 |
| | 10.9 | 11.7 | 8.8 | 13.9 |
| | 12.4 | 12.4 | 10.1 | 13.2 |
| | 12.8 | 12.6 | 9.0 | 14.4 |
| | 11.9 | 13.3 | 9.7 | 12.5 |
| | 11.2 | 11.1 | 8.3 | 13.1 |
| TEST 3 (Breaker positioned standing on its length on top of coil and test performed immediately after a first test: "Hot Reset") | | | | |
| Time Heating to trip (sec) | 8.0 | 6.5 | 5.5 | 7.5 |
| TEST 4 (Breaker positioned standing on its length on top of coil and performed after breaker was allowed to cool after first test but not to room temperature: "Semi-Cool Retest") | | | | |
| Time Heating to trip (sec) | 7.8 | 8.3 | 6.8 | 9.0 |
| TEST 5 (Breaker positioned standing on its length on top of coil with load end of breaker centered in coils and re-test performed after samples were cooled but not to room temperature "Semi Cool-Retest") | | | | |
| Time Heating to trip (sec) | 11.5 | 10.9 | 3.5* | 13.0 |
| TEST 6 (Breaker positioned on its side on top of and centered in coils and re-test performed while sample was still warm "Warm Retest") | | | | |
| Time Heating to trip (sec) | 4.5 | 3.0 | 1.9 | 3.9 |
| TEST 7 (Breaker positioned on its other side on top of coil and re-test performed while sample was hot "Hot-Retest") | | | | |
| Time Heating to trip (sec) | 2.9 | 6.3** | 2.8 | 6.0 |

*Anomolous result
**Improperly positioned.

Thus, it should be apparent that there has been provided in accordance with the present invention an apparatus that fully satisfies the objection and advantages set forth above. While the foregoing description and drawings represent the preferred embodiments of the present invention, it will be apparent to those skilled in the art that various changes and modifications may be made therein without departing from the true spirit and scope of the present invention. For example, the induction coil can be positioned entirely under the conveyance. Another example provides the conveyance composed of non-metallic rollers upon which the circuit breaker moves. Accordingly, it is intended to embrace all such alternatives, modifications and variations that fall with the spirit and broad scope of the appended claims.

What is claimed is:

1. A test apparatus to determine the trip setting of a bimetallic element of a thermal tripping mechanism of a circuit breaker, the test apparatus comprising:

a conveyance configured to receive and move the circuit breaker;

a radio frequency induction heater positioned below the conveyance; and, an induction coil operatively connected to the induction heater, wherein the induction coil is located below the bimetallic element of the thermal tripping mechanism of the circuit breaker.

2. The test apparatus of claim 1, wherein the radio frequency induction heater operates with a frequency of 250 KHz to 750 KHz.

3. The test apparatus of claim 1, wherein the radio frequency induction heater operates at a frequency of 450 KHz.

4. The test apparatus of claim 1, including a mechanical ejection apparatus configured to remove the circuit breaker from the conveyance if the circuit breaker did not meet predetermined criteria; and, an electrical test apparatus configured to test the circuit breaker if the circuit breaker met predetermined criteria.

5. A test apparatus to heat a bimetallic element of a thermal tripping mechanism of a circuit breaker to a predetermined temperature that will trip the tripping mechanism, the test apparatus comprising:

a conveyance configured to receive and move the circuit breaker;

a radio frequency induction heater positioned underneath the conveyance; and, an induction coil operatively connected to the induction heater, wherein the induction coil is located below the bimetallic element of the thermal tripping mechanism of the circuit breaker.

6. The test apparatus of claim 5, wherein the radio frequency induction heater operates with a frequency of 250 KHz to 750 KHz.

7. The test apparatus of claim 5, wherein the radio frequency induction heater operates at a frequency of 450 KHz.

8. The test apparatus of claim 5, including a mechanical ejection apparatus configured to remove the circuit breaker from the conveyance if the circuit breaker did not meet predetermined criteria; and, an electrical test apparatus configured to test the circuit breaker if the circuit breaker met predetermined criteria.

9. A test apparatus to heat a bimetallic element of a thermal tripping mechanism in a circuit breaker to a predetermined temperature that will deflect the bimetal element in the thermal tripping mechanism in response to such temperature, the test apparatus comprising:

a conveyance configured to receive and move the circuit breaker;

a radio frequency induction heater positioned below the conveyance; and, an induction coil operatively connected to the induction heater, wherein the induction coil is located below the bimetallic element of the thermal tripping mechanism of the circuit breaker.

10. The test apparatus of claim 9, wherein the radio frequency induction heater operates with a frequency of 250 KHz to 750 KHz.

11. The test apparatus of claim 9, wherein the radio frequency induction heater operates at a frequency of 450 KHz. The test apparatus of claim 9, including a mechanical ejection apparatus configured to remove the circuit breaker from the conveyance if the circuit breaker did not meet predetermined criteria; and, an electrical test apparatus configured to test the circuit breaker if the circuit breaker met predetermined criteria.

12. A test apparatus to determine the trip setting of a bimetallic element of a thermal tripping mechanism of a circuit breaker, the test apparatus comprising:

a means for conveying configured to receive and move the circuit breaker;

a means for generating heat positioned underneath the means for conveying; and, a means for inducing heat operatively connected to the means for generating heat wherein the means for inducing heat is located below the bimetallic element of the thermal tripping mechanism of the circuit breaker.

13. The test apparatus of claim 12, wherein the means for generating heat operates with a frequency of 250 KHz to 750 KHz.

14. The test apparatus of claim 13, wherein the means for generating heat operates at a frequency of 450 KHz.

15. The test apparatus of claim 13 including a means for mechanically ejecting the circuit breaker from the means for conveying if the circuit breaker did not meet predetermined criteria; and, a means for electrically testing the circuit breaker if the circuit breaker met predetermined criteria.

* * * * *